US009125312B2

(12) United States Patent
Anderson et al.

(10) Patent No.: US 9,125,312 B2
(45) Date of Patent: Sep. 1, 2015

(54) ELECTRICAL POWER SUPPLY SYSTEMS INCLUDING NON-FREESTANDING ACCESSORIES AND METHODS FOR USING SAME

(71) Applicant: Eaton Corporation, Cleveland, OH (US)

(72) Inventors: Jason Scott Anderson, Raleigh, NC (US); Karen Lynn Cronin, Raleigh, NC (US); Justin Raymond Hoglund, Wake Forest, NC (US); Johnnie Michael Carnes, Apex, NC (US)

(73) Assignee: Eaton Corporation, Cleveland, OH (US)

( * ) Notice: Subject to any disclaimer, the term of this patent is extended or adjusted under 35 U.S.C. 154(b) by 252 days.

(21) Appl. No.: 13/688,923

(22) Filed: Nov. 29, 2012

(65) Prior Publication Data

US 2014/0146483 A1    May 29, 2014

(51) Int. Cl.
| | |
|---|---|
| H05K 5/00 | (2006.01) |
| H05K 7/00 | (2006.01) |
| G06F 1/16 | (2006.01) |
| H05K 7/10 | (2006.01) |
| H05K 13/04 | (2006.01) |
| H02B 1/30 | (2006.01) |
| H05K 7/18 | (2006.01) |

(52) U.S. Cl.
CPC .................. *H05K 7/10* (2013.01); *H02B 1/308* (2013.01); *H05K 5/0021* (2013.01); *H05K 7/18* (2013.01); *H05K 13/0486* (2013.01); *Y10T 29/49817* (2015.01)

(58) Field of Classification Search
CPC .......... H05K 7/10; H05K 7/18; H05K 5/0021

USPC .................. 361/679.39, 724, 725, 726, 727, 361/679.01, 679.41–679.44; 312/223.1, 312/223.2, 223.3
See application file for complete search history.

(56) References Cited

U.S. PATENT DOCUMENTS

| | | | |
|---|---|---|---|
| 6,312,068 B1 | 11/2001 | Benner et al. | |
| 6,462,961 B1 * | 10/2002 | Johnson et al. ............... | 361/825 |
| 8,579,389 B1 * | 11/2013 | Kuo .............................. | 312/111 |
| 8,668,283 B2 * | 3/2014 | Fan et al. ...................... | 312/198 |
| 2002/0044420 A1 * | 4/2002 | Chen ............................. | 361/686 |

FOREIGN PATENT DOCUMENTS

| | | |
|---|---|---|
| DE | 8710424 U1 | 10/1987 |
| EP | 1202412 A2 | 5/2002 |
| WO | WO 2010048153 A2 | 4/2010 |

OTHER PUBLICATIONS

International Search Report and Written Opinion corresponding to International Application No. PCT/US2013/071415; Date of Mailing: May 27, 2014 (10 pages).

* cited by examiner

*Primary Examiner* — Anthony Haughton
(74) *Attorney, Agent, or Firm* — Myers Bigel Sibley & Sajovec, PA (57) ABSTRACT

An electrical power supply system includes a freestanding primary electrical unit, a non-freestanding accessory unit, and an accessory unit support system. The primary electrical unit includes a freestanding cabinet containing a primary electrical component. The accessory unit includes a non-freestanding accessory cabinet containing an accessory electrical component. The accessory unit support system is configured to couple the accessory cabinet to the primary cabinet such that the accessory unit is thereby structurally supported by the primary electrical unit. The accessory cabinet can be selectively decoupled from the primary cabinet and alternatively structurally supported using the accessory support system.

19 Claims, 9 Drawing Sheets

ELECTRICAL POWER SUPPLY SYSTEMS INCLUDING NON-FREESTANDING ACCESSORIES AND METHODS FOR USING SAME

FIELD OF THE INVENTION

The present invention relates to electrical power supply systems and methods.

BACKGROUND OF THE INVENTION

Local power supply systems commonly include various primary electrical equipment (e.g., a freestanding, uninterruptable power supply (UPS) unit) and accessories (e.g., a maintenance bypass switch (MBS)) associated with the primary electrical equipment. Such accessories are typically provided as freestanding units or are permanently attached to (e.g., integrated into) the primary electrical equipment

SUMMARY OF THE INVENTION

According to embodiments of the present invention, an electrical power supply system includes a freestanding primary electrical unit, a non-freestanding accessory unit, and an accessory unit support system. The primary electrical unit includes a freestanding cabinet containing a primary electrical component. The accessory unit includes a non-freestanding accessory cabinet containing an accessory electrical component. The accessory unit support system is configured to couple the accessory cabinet to the primary cabinet such that the accessory unit is thereby structurally supported by the primary electrical unit. The accessory cabinet can be selectively decoupled from the primary cabinet and alternatively structurally supported using the accessory support system.

According to some embodiments, the accessory unit is selected from the group consisting of an external battery cabinet, a distribution cabinet, a maintenance bypass cabinet, a tie cabinet, and an input transformer cabinet.

According to some embodiments, the primary electrical unit is an uninterruptible power supply (UPS).

According to some embodiments, the electrical power supply system further includes a freestanding secondary electrical unit including a freestanding secondary cabinet containing a secondary electrical component, and the accessory cabinet can be selectively decoupled from the primary cabinet and alternatively coupled to the secondary cabinet such that the accessory unit is thereby structurally supported by the secondary electrical unit. In some embodiments, the accessory unit is selected from the group consisting of an external battery cabinet, a distribution cabinet, a maintenance bypass cabinet, a tie cabinet, and an input transformer cabinet, the primary electrical unit is an uninterruptible power supply (UPS), and the secondary electrical unit is selected from the group consisting of an external battery cabinet, a distribution cabinet, a maintenance bypass cabinet, a tie cabinet, and an input transformer cabinet.

In some embodiments, the accessory unit support system includes a coupling bracket configured to secure the accessory cabinet to each of the primary cabinet and, alternatively, the secondary cabinet. Each of the accessory cabinet, the primary cabinet and the secondary cabinet may include an integral coupling feature to cooperate with the coupling bracket to secure the coupling bracket thereto. In some embodiments, the accessory unit support system includes a plurality of fasteners, and the coupling features of the accessory cabinet, the primary cabinet and the secondary cabinet are configured to mate with the plurality of fasteners to secure the coupling bracket to the accessory cabinet, the primary cabinet and the secondary cabinet, respectively.

At least one of the accessory cabinet, the primary cabinet and the secondary cabinet may include a coupling bracket seat slot configured and positioned to receive the coupling bracket therein.

In some embodiments, the first coupling bracket is a roof coupling bracket configured to secure the accessory cabinet to each of a roof panel of the primary cabinet and, alternatively, a roof panel of the secondary cabinet, and the accessory unit support system further includes a base coupling bracket configured to secure the accessory cabinet to each of a base panel of the primary cabinet and, alternatively, a base panel of the secondary cabinet.

The accessory unit system may include at least one floor support bracket configured to temporarily structurally support the accessory unit in a freestanding mode.

According to method embodiments of the present invention, a method for managing an electrical power supply system includes providing: a freestanding primary electrical unit including a freestanding primary cabinet containing a primary electrical component; a non-freestanding accessory unit including a non-freestanding accessory cabinet containing an accessory electrical component; and an accessory unit support system. The method further includes: forming a first installation including the accessory unit, including coupling the accessory cabinet to the primary cabinet using the accessory unit support system such that the accessory unit is thereby structurally supported by the primary electrical unit; thereafter selectively decoupling the accessory cabinet from the primary cabinet; and thereafter forming a second installation including the accessory unit and configured differently than the first installation, including alternatively structurally supporting the accessory unit using the accessory support system.

According to some embodiments, the accessory unit is selected from the group consisting of an external battery cabinet, a distribution cabinet, a maintenance bypass cabinet, a tie cabinet, and an input transformer cabinet.

According to some embodiments, the primary electrical unit is an uninterruptible power supply (UPS).

In some embodiments, the electrical power supply system further includes a freestanding secondary electrical unit including a freestanding secondary cabinet containing a secondary electrical component, and the step of alternatively structurally supporting the accessory unit using the accessory support system includes coupling the accessory cabinet to the secondary cabinet such that the accessory unit is thereby structurally supported by the secondary electrical unit.

In some embodiments, the accessory unit is selected from the group consisting of an external battery cabinet, a distribution cabinet, a maintenance bypass cabinet, a tie cabinet, and an input transformer cabinet, the primary electrical unit is selected from the group consisting of an uninterruptible power supply (UPS), and the secondary electrical unit is selected from the group consisting of an external battery cabinet, a distribution cabinet, a maintenance bypass cabinet, a tie cabinet, and an input transformer cabinet.

According to some embodiments, the accessory unit support system includes a coupling bracket, the step of coupling the accessory cabinet to the primary cabinet includes securing the accessory cabinet to the primary cabinet using the coupling bracket, and the step of coupling the accessory cabinet to the secondary cabinet includes securing the accessory cabinet to the secondary cabinet using the coupling bracket. Each of the accessory cabinet, the primary cabinet and the secondary cabinet may include an integral coupling feature to cooperate with the coupling bracket to secure the coupling bracket thereto.

In some embodiments, the step of securing the accessory cabinet to the primary cabinet includes securing the coupling bracket to the primary cabinet using at least one fastener mated to the coupling feature of the primary cabinet, and the step of securing the accessory cabinet to the secondary cabinet includes securing the coupling bracket to the secondary cabinet using at least one fastener mated to the coupling feature of the secondary cabinet.

At least one of the accessory cabinet, the primary cabinet and the secondary cabinet may include a coupling bracket seat slot configured and positioned to receive the coupling bracket therein.

According to some embodiments, the coupling bracket is a roof coupling bracket and the accessory unit support system further includes a base coupling bracket. The step of coupling the accessory cabinet to the primary cabinet includes: coupling a roof panel of the accessory cabinet to a roof panel of the primary cabinet using the roof coupling bracket; and coupling the base panel of the accessory cabinet to a base panel of the primary cabinet using the base coupling bracket. The step of coupling the accessory cabinet to the secondary cabinet includes: coupling the roof panel of the accessory cabinet to a roof panel of the secondary cabinet using the roof coupling bracket, and coupling the base panel of the accessory cabinet to a base panel of the secondary cabinet using the base coupling bracket.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 9:
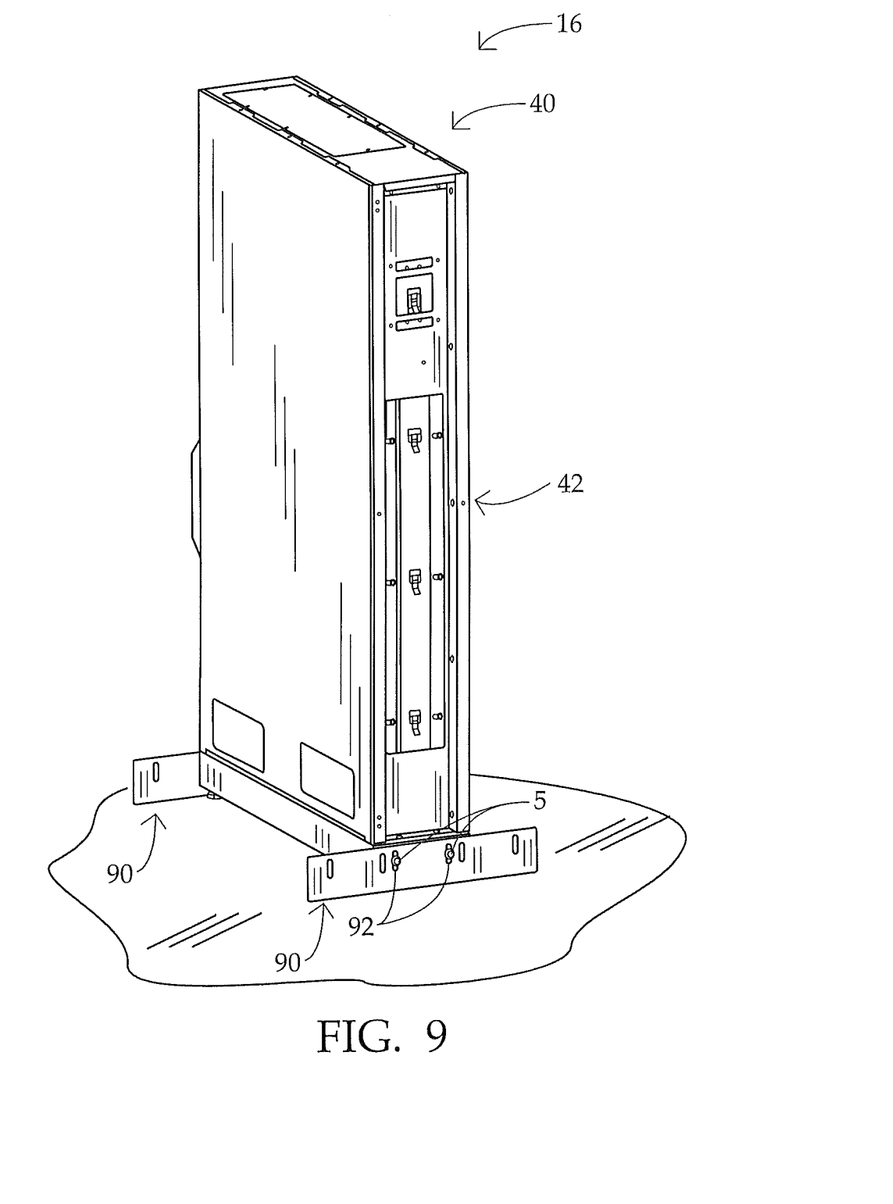
FIG. 9 is a front perspective view of the accessory unit supported by floor support brackets.

With reference to FIGS. 1-10, an electrical power supply system 10 according to embodiments of the present invention is shown therein. As discussed herein, the system 10 can be selectively and alternatively configured into a plurality of configurations or installations 12 (FIGS. 1-4), 14 (FIG. 8), or 16 (FIG. 9).

The electrical power supply system 10 includes a primary electrical unit 30, an accessory unit 40, and an accessory unit support system 60. The system 10 may, in some embodiments, further include a secondary electrical unit 50.

Figure 1:
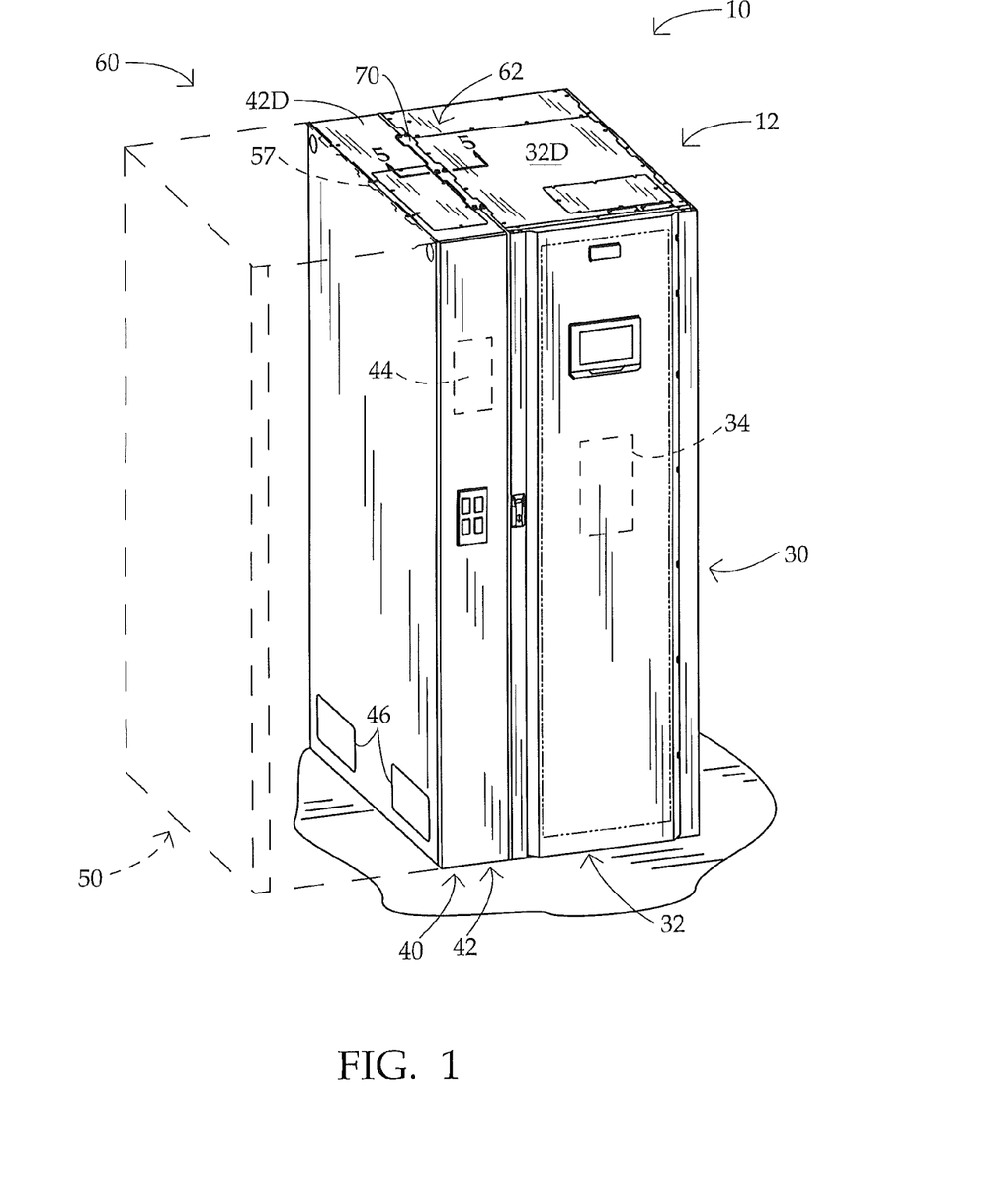
FIG. 1 is a perspective view of an electrical power supply system according to embodiments of the present invention configured as a first electrical power supply installation.

With reference to FIG. 1, the primary electrical unit 30 includes a cabinet 32 containing and/or supporting one or more electrical components 34 (schematically illustrated). The cabinet 32 includes a side panel 32A, a base panel 32C (FIG. 4), and a roof panel 32D. Wiring holes 36 (FIGS. 2 and 4) are defined in the side panel 32A for routing electrical wires into and out of the cabinet 32. The cabinet 32 may be formed of any suitable material and, in some embodiments, is formed of steel.

With reference to FIG. 1, the accessory unit 40 includes a cabinet 42 containing and/or supporting one or more electrical components 44 (schematically illustrated). The cabinet 42 includes opposed side panels 42A, 42B, a base panel 42C (FIG. 4), and a roof panel 42D. Wiring holes 46 are defined in the side panels 42A, 42B for routing electrical wires into and out of the cabinet 42. The cabinet 42 may be formed of any suitable material and, in some embodiments, is formed of steel.

The accessory unit 40 is characterized in that the cabinet 42 is a non-freestanding cabinet and the accessory unit 40 may be referred to as a non-freestanding accessory or accessory unit. The accessory unit 40 is not designed to be installed without supplemental support. Rather, owing to its relative dimensions and/or weight distribution, the accessory unit 40 standing alone would typically be too unstable for satisfactory or safe service.

According to some embodiments, the accessory unit 40 is or includes at least one of an external battery cabinet, a distribution cabinet, a maintenance bypass cabinet, a tie cabinet, and an input transformer cabinet.

The primary electrical unit 30 and the secondary unit 50 are characterized in that they are configured to be freestanding units having freestanding cabinets 32 and 52. The electrical units 30, 50 are designed to be installed without supplemental support. Owing to each unit's 30, 50 relative dimensions and/or weight distribution, the unit 30, 50 is sufficiently stable and safe in service when installed unsupported.

According to some embodiments, the primary electrical unit 30 is an uninterruptible power supply (UPS).

According to some embodiments, the secondary electrical unit 50 is or includes at least one of an external battery cabinet, a distribution cabinet, a maintenance bypass cabinet, a tie cabinet, and an input transformer cabinet.

The accessory support system 60 includes a roof coupling bracket 70, a base coupling bracket 80, a pair of floor support brackets 90, a set of roof screw holes 38 (in the roof panel 32D), a set of base fastener holes 39 (in the base panel 32C), a set of roof fastener holes 48 (in the roof panel 42D), a set of base fastener holes 49 (in the base panel 42C), a set of roof fastener holes 58 (in the roof panel 52D), a set of base fastener holes 59 (in the base panel 52C), a bracket seat slot 37 (in the roof panel 32D), a bracket seat slot 57 (in the roof panel 52D), and a plurality of fasteners 5 (such as screws or bolts). According to some embodiments, the fastener holes 38, 39, 48, 49, 58, 59 are screw holes internally threaded to engage cooperating threads of the fasteners 5.

Figure 3:
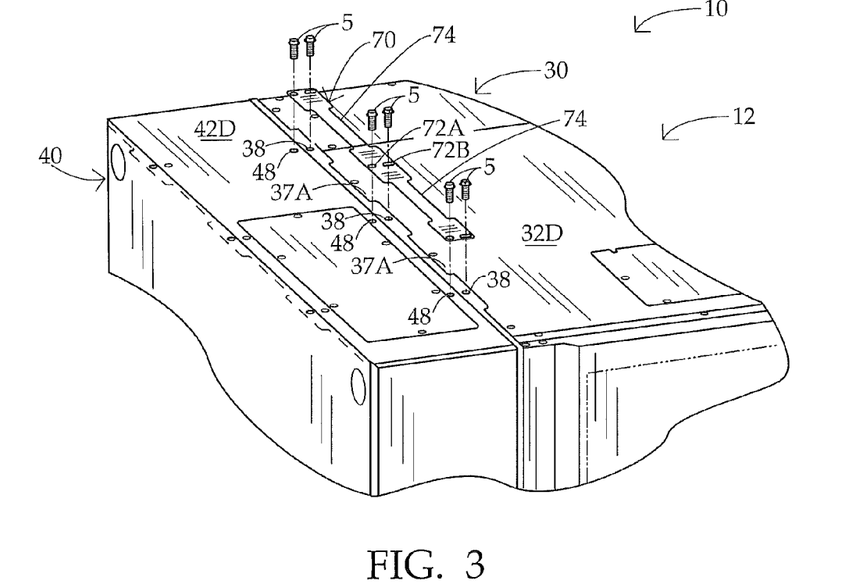
FIG. 3 is an enlarged, fragmentary, exploded, perspective view of the electrical power supply system of FIG. 1 illustrating a primary electrical unit/accessory unit roof connection according to embodiments of the present invention.
Figure 5:
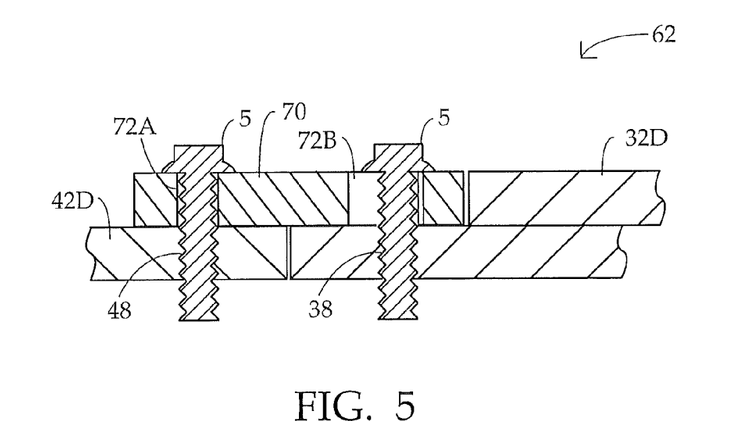
FIG. 5 is an enlarged, fragmentary, cross-sectional view of the electrical power system of FIG. 1 taken along the line 5-5 of FIG. 1.
Figure 6:
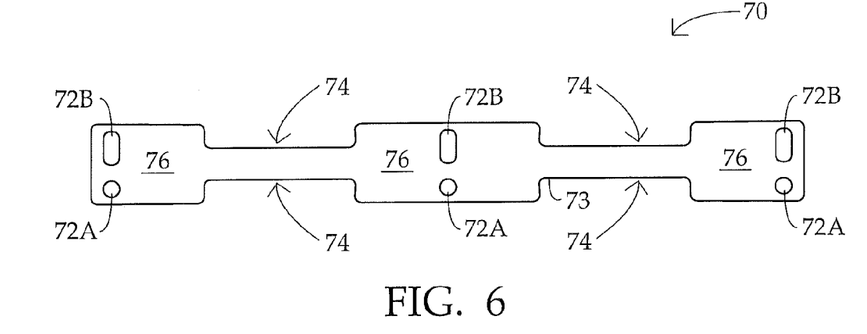
FIG. 6 is a top plan view of a roof coupling bracket forming a part of the primary electrical unit/accessory unit roof connection of FIG. 3.

Referring to FIGS. 3, 5 and 6, the roof coupling bracket 70 includes three pairs of fastener openings 72A, 72B. In some embodiments and as shown, the openings 72B are laterally elongated slots and the openings 72A are not. Three mounting sections 76 and four lateral recesses 74 therebetween are defined by the outer perimeter 73 of the bracket 70. The bracket 70 may be formed of any suitable material and, in some embodiments, is formed of steel.

Figure 4:
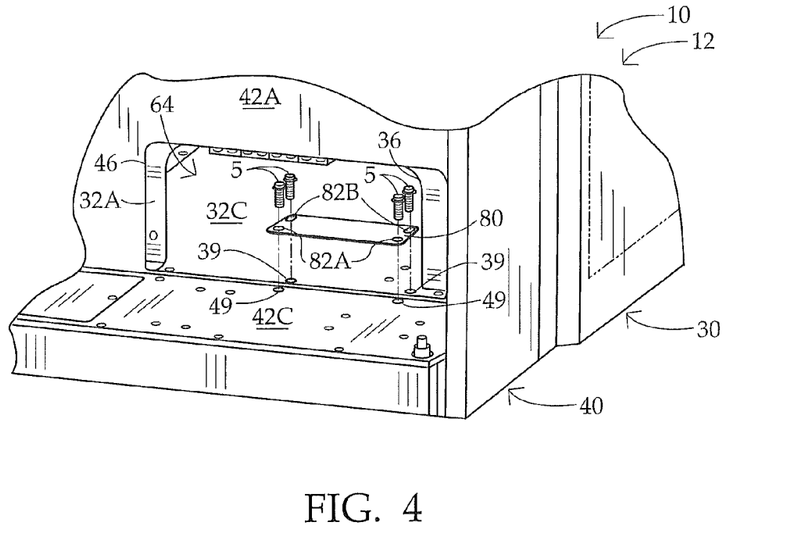
FIG. 4 is an enlarged, fragmentary, exploded, perspective view of the electrical power supply system of FIG. 1 illustrating a primary electrical unit/accessory unit base connection according to embodiments of the present invention.
Figure 7:
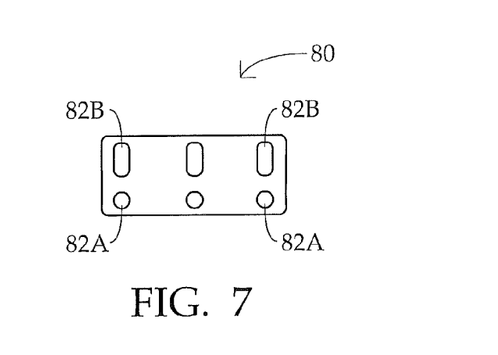
FIG. 7 is a top plan view of a base coupling bracket forming a part of the primary electrical unit/accessory unit base connection of FIG. 4.
Figure 8:
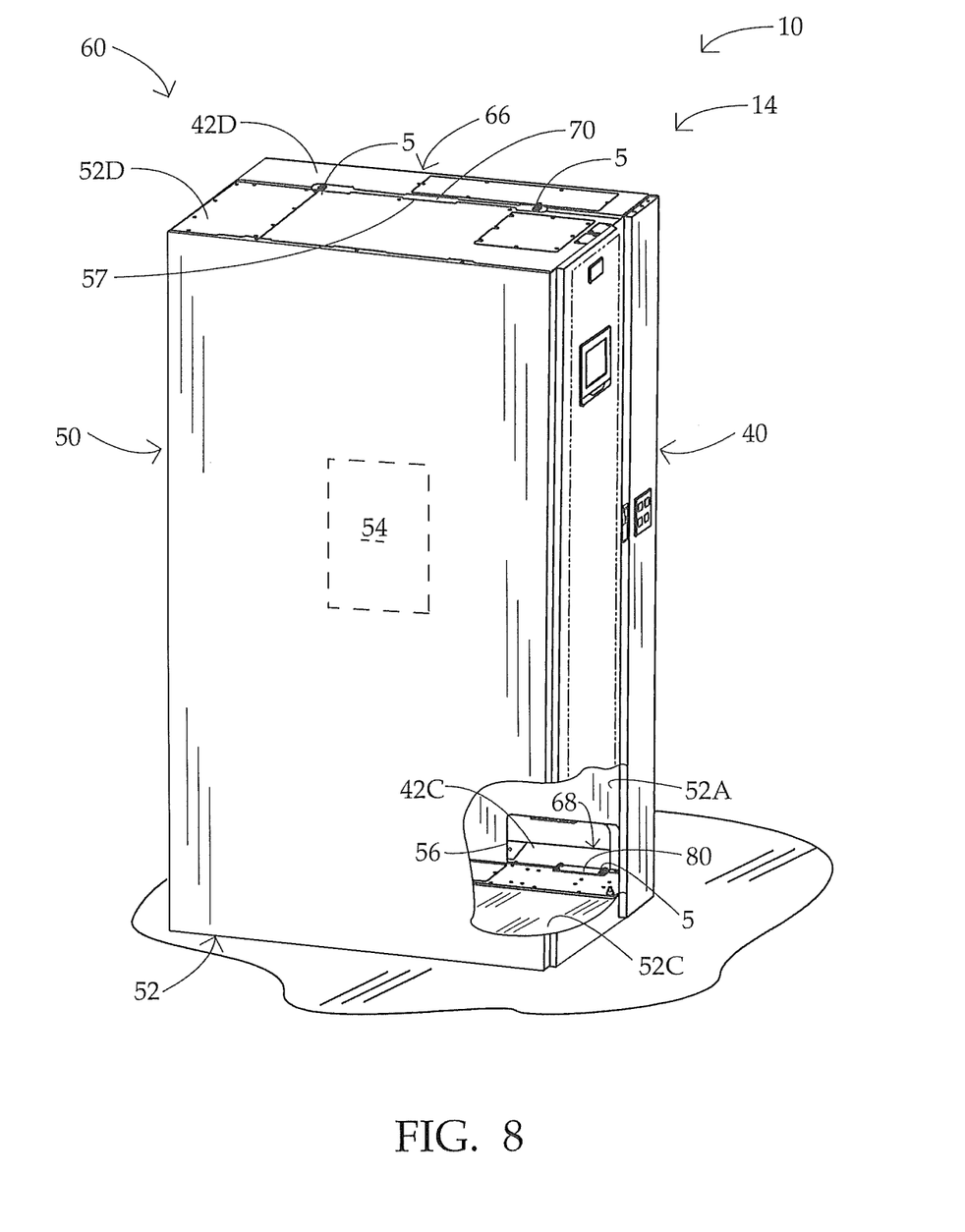
FIG. 8 is a perspective view of the electrical power supply system of FIG. 1 reconfigured as a second electrical power supply installation.

With reference to FIGS. 4 and 7, the base coupling bracket 80 includes two pairs of fastener openings 82A, 82B. In some embodiments and as shown, the openings 82B are laterally elongated slots and the openings 82A are not. The base coupling bracket 80 may be formed of any suitable material and, in some embodiments, is formed of steel.

The system 10 may be used as follows in accordance with embodiments of the present invention. For the purposes of illustration and explanation, the system 10 will be described with inclusion of the secondary electrical unit 50. However, it will be appreciated that in some embodiments no secondary electrical unit 50 is provided or used for the support of the accessory unit 40.

With reference to FIGS. 1-4, the system 10 is first assembled in a first configuration or installation 12 as shown therein. In the installation 12, the primary electrical unit 30 and the accessory unit 40 are positioned in side-by-side relation with the side panels 32A and 42A adjacent one another and the roof panels 32D and 42D likewise adjacent one another. The accessory unit 40 is secured to the electrical unit 30 by a roof connection 62 and a base connection 64, as discussed below. The connections 62, 64 may be formed on site or may be formed before delivery of the units 30 and 40 to the installation site. The secondary electrical unit 50 (shown in dashed lines in FIGS. 1 and 2 for the purpose of explanation) is positioned adjacent the side panel 42B but is not secured to the accessory unit 40.

With reference to FIGS. 1 and 3, the roof coupling bracket 70 is placed on the roof panels 32D and 42D so that the bracket 70 partially spans or overlaps each roof panel 32D, 42D and the openings 72A, 72B align with the screw holes 38, 48. The bracket seat slot 37 is complementary to the bracket 70 so that the bracket 70 nests into the slot 37 and prongs 37A of the roof panel 32D are received in the recesses 74. The fasteners 5 are inserted through the openings 72A, 72B and tightened into the screw holes 38, 48 to form the connection 62 and to secure the bracket 70 to the roof panels 32D, 42D, and thereby secure the accessory unit cabinet 42 to the primary electrical unit cabinet 32. The slotted openings 72B can enable small adjustments as needed to align the openings 72A, 72B with the openings 38, 48.

Figure 2:
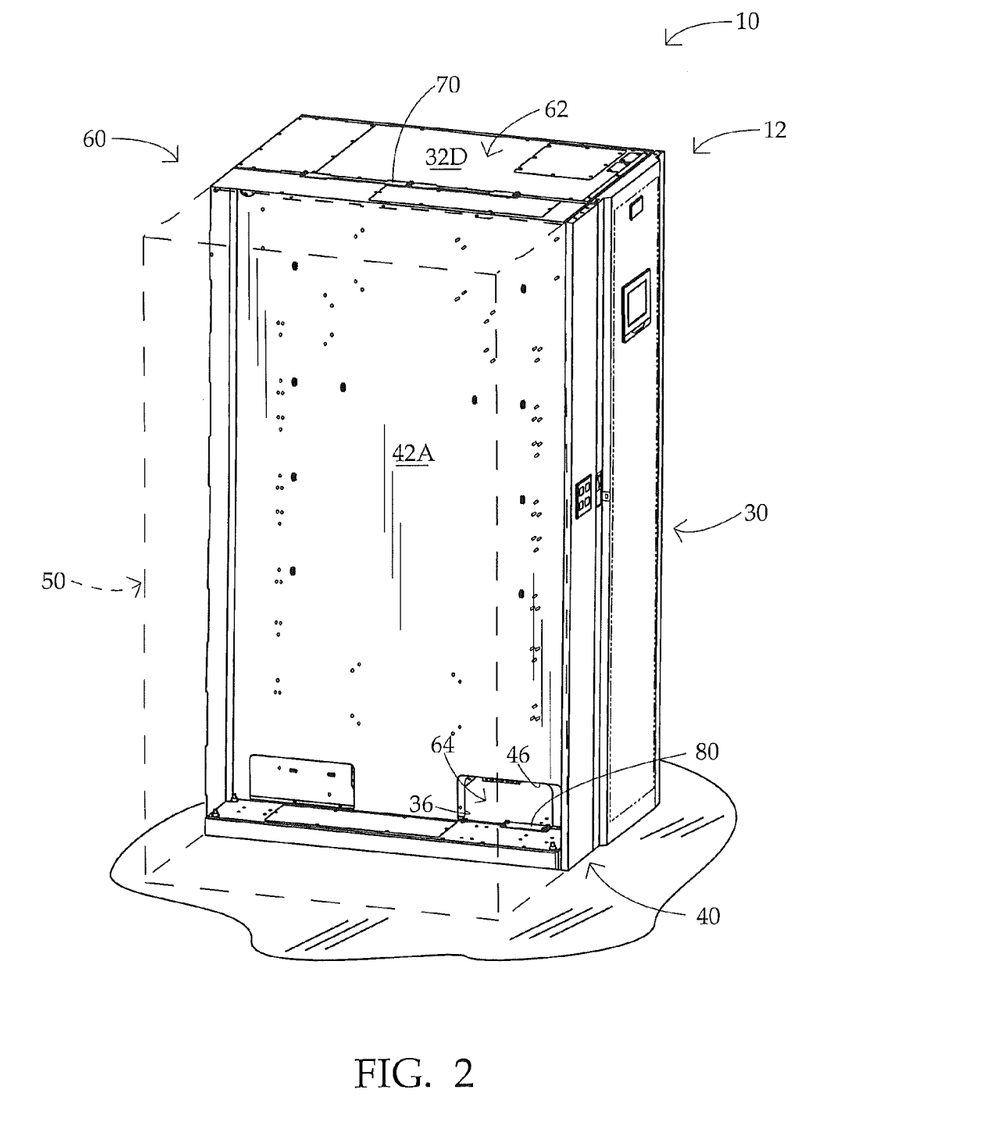
FIG. 2 is a fragmentary, perspective view of the electrical power supply installation of FIG. 1.

With reference to FIGS. 2 and 4, the base coupling bracket 80 is placed on the base panels 32C and 42C so that the bracket 80 extends through the wiring holes 36, 46 and overlaps each of the base panels 32C, 42C and the screw openings 82A, 82B align with the screw holes 39 and 49. The fasteners 5 are inserted through the screw openings 82A, 82B and tightened into the screw holes 39, 49 to form the connection 64 and to secure the bracket 80 to the base panels 32C and 42C, and thereby secure the accessory unit cabinet 42 to the primary electrical unit cabinet 32.

The non-freestanding accessory unit 40 is thus structurally supported by the primary electrical unit 30 via the brackets 70 and 80. The unit 30 may have a bracket seat slot 37 and sets of screw holes 38, 39 on its opposite side as well to permit the accessory unit 40 to be mounted on the opposite side.

In the event an operator wishes to remove the unit 30 from the installation, the system 10 can be selectively reconfigured to form a second configuration or installation 14 (FIG. 8) wherein the accessory unit 40 is instead structurally supported by the secondary electrical unit 50. The fasteners 5 are removed to uninstall the brackets 70, 80 from the primary electrical unit 30 and the accessory unit 40. The brackets 70, 80 (or new brackets) are then reinstalled using the screws 5 (or new fasteners) and the screw holes 48, 49 and 58, 59 to form the secondary electrical unit roof connection 66 and the secondary electrical base connection 68 in the same manner as described above for the connections 62 and 64. In the connection 68, the bracket 80 will extend through the wiring holes 46, 56.

In the event the operator does not desire or is unable to couple the accessory unit 40 to the unit 30 or the unit 50, the operator can alternatively mount the support brackets 90 on the accessory unit 40 to temporarily structurally support the accessory unit 40 in a freestanding mode as shown in FIG. 9, forming a third configuration or installation 16. When a suitable freestanding unit (e.g., the unit 30 or 50) is again positioned adjacent the accessory unit 40, the brackets 90 can be removed and the brackets 70, 80 can be remounted on the accessory unit 40 for supporting the accessory unit 40 as described above. The brackets 90 can be secured to the front and rear sides of the base of the accessory cabinet 42 using suitable fasteners 5 (e.g., screws) and inserted through fastener openings 92 into screw holes 47 in the base of the cabinet 42. The bracket 90 should be sufficiently long, relative to the dimensions and weight distribution of the unit 40, to stably and safely support the unit 40. When not in use, and during shipping, the brackets 90 may be stored inside the accessory cabinet 42 as shown in FIG. 10.

Figure 10:
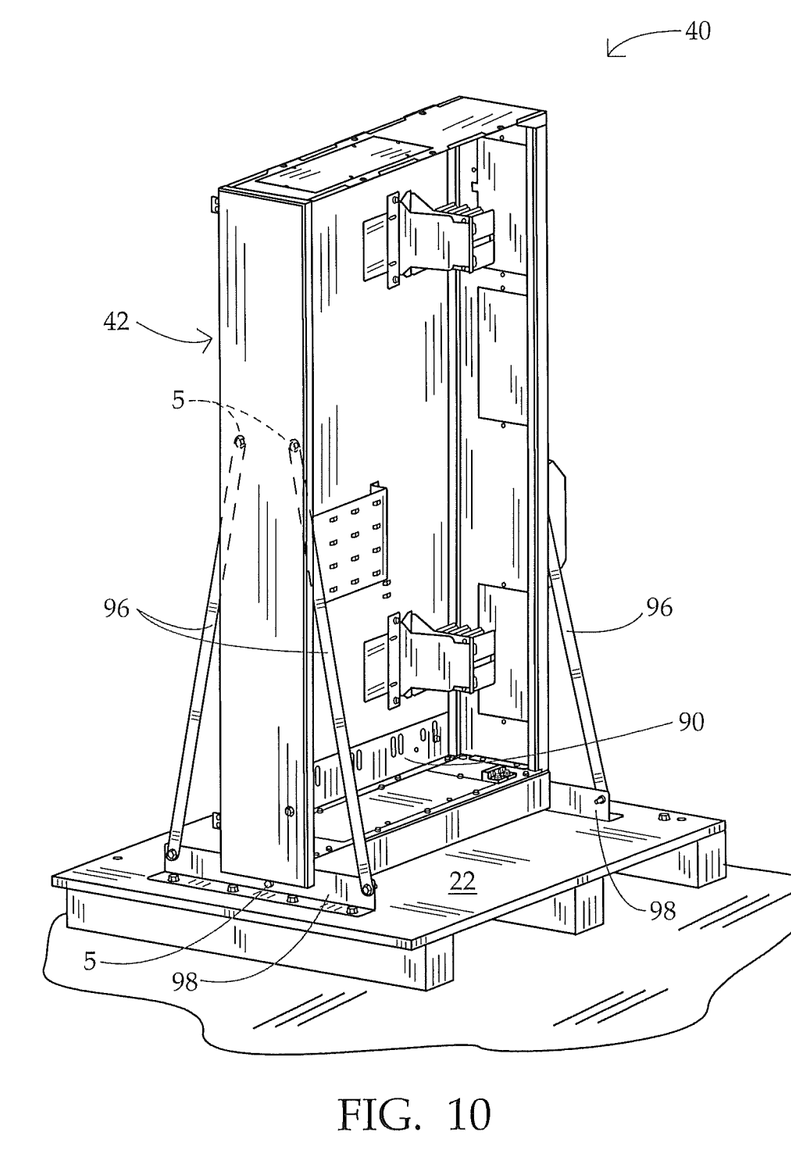
FIG. 10 is a fragmentary, front perspective view of the accessory unit mounted on a pallet with support straps.

With reference to FIG. 10, the accessory unit 40 may be shipped on a pallet 22 and supported by straps 96 and brackets 98 temporarily bolted to the pallet 22 and the accessory cabinet 42 as shown.

Figure 11:
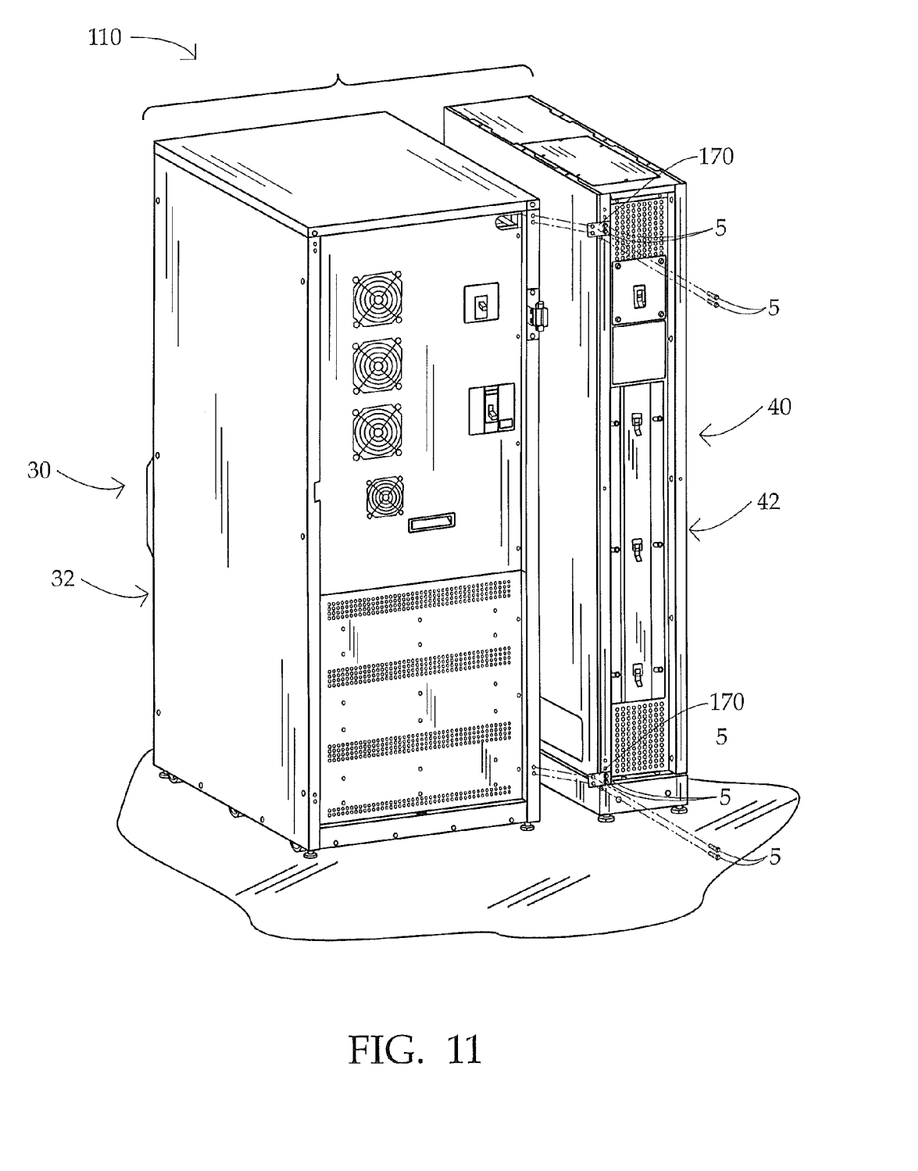
FIG. 11 is an exploded, front perspective view of an electrical power supply system according to further embodiments of the invention.
Figure 12:
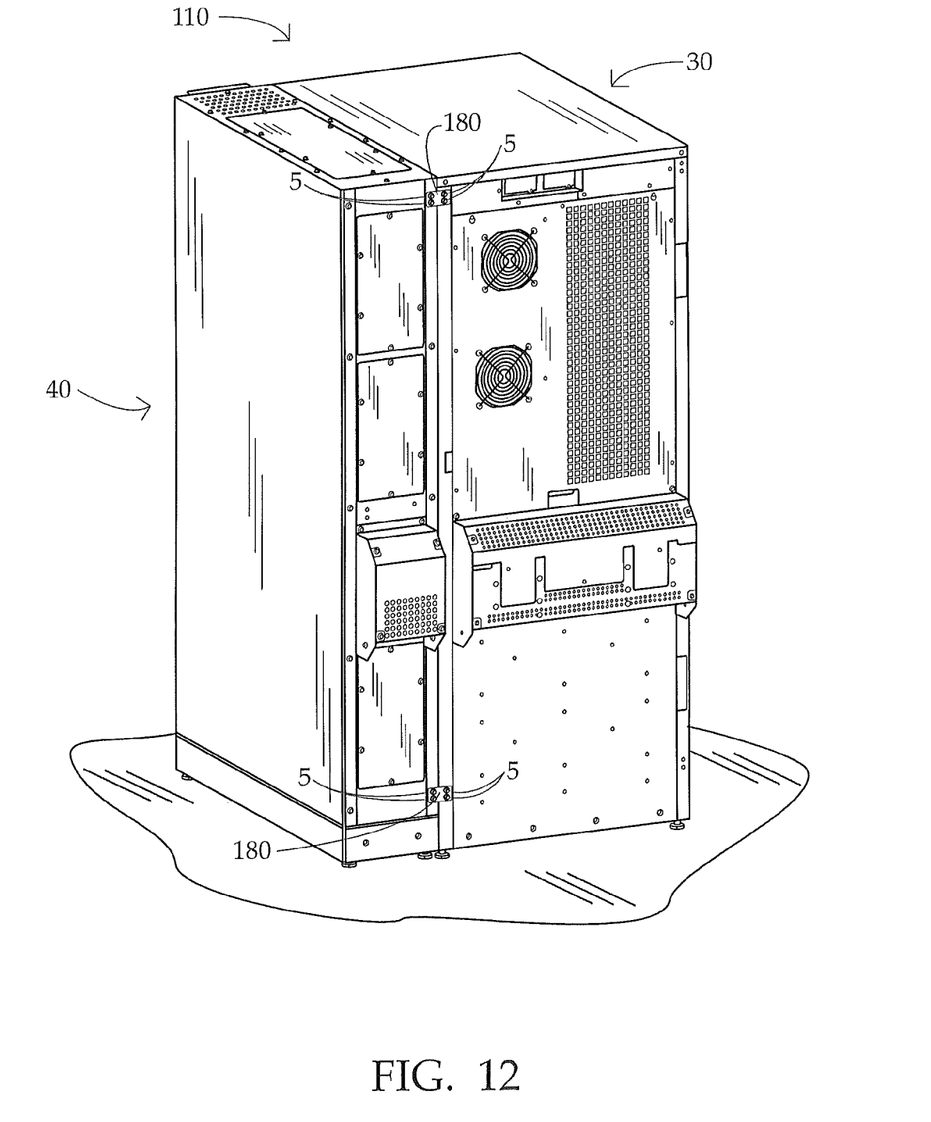
FIG. 12 is a rear perspective view of the electrical power supply system of FIG. 11.

With reference to FIGS. 11 and 12, an electrical power supply system 110 according to further embodiments of the invention is shown therein. The system 110 generally corresponds to the system 10 except that front coupling brackets 170 and rear coupling brackets 180 are used in place of the brackets 70, 80. The front coupling brackets 170 are secured by screws 5 to the front panels of the accessory cabinet 42 and the primary cabinet 32, and the rear coupling brackets 180 are secured to the rear panels of the cabinets 42, 32 by fasteners 5. The accessory unit 40 is thereby structurally supported by the unit 30 via the brackets 170, 180. The brackets 170, 180 can be transferred to couple the unit 40 to another freestanding unit (e.g., the unit 50) as discussed with regard to the brackets 70, 80.

Non-freestanding accessories have the benefit of utilizing less floor space than freestanding accessories. However, non-freestanding accessories must be structurally supported by another piece of equipment. Because of this requirement, non-freestanding accessories have been, in the past, permanently attached to or integrated into primary equipment. Accessory unit support systems of the present invention (e.g., the accessory support system 60) enable a user to detach the non-freestanding accessory (e.g., the accessory unit 40) from the primary equipment (e.g., the primary equipment unit 30), allowing for complete removal of the primary equipment while the accessory remains in place. Electrical power supply systems as disclosed herein can maintain the low floor space utilization of a non-freestanding accessory but also provide the added benefit of making the accessory detachable from the primary equipment. The accessory is structurally attached with the primary equipment but can be detached from the primary equipment and reattached to an adjacent piece of equipment, for structural support, within the same product line design. If there is no equipment adjacent to the non-freestanding accessory, support brackets may be attached to the accessory and used for structural support. The inventive design can allow the primary piece of equipment to be removed completely from the system while the accessory stays in the system. The system of the present invention thus provides the low floor space utilization benefit of an internal accessory (e.g., an internal maintenance bypass switch) with the functionality of an external accessory. Aspects of the invention can be used in any case where it would be advantageous to separate the accessory from the primary equipment.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

That which is claimed is:

1. An electrical power supply system comprising:
 a freestanding primary electrical unit including a freestanding primary cabinet containing a primary electrical component;
 a non-freestanding accessory unit including a non-freestanding accessory cabinet containing an accessory electrical component; and
 an accessory unit support system configured to couple the accessory cabinet to the primary cabinet such that the accessory unit is thereby structurally supported by the primary electrical unit, wherein the accessory cabinet can be selectively decoupled from the primary cabinet and alternatively structurally supported using the accessory support system;
 wherein, when the accessory cabinet is coupled to the primary cabinet, the accessory cabinet is disposed adjacent and externally of the primary cabinet; and
 wherein:
  the electrical power supply system further includes a freestanding secondary electrical unit including a freestanding secondary cabinet containing a secondary electrical component;
  the accessory cabinet can be selectively decoupled from the primary cabinet and alternatively coupled to the secondary cabinet such that the accessory unit is thereby structurally supported by the secondary electrical unit;
  when the accessory cabinet is coupled to the secondary cabinet, the accessory cabinet is disposed adjacent and externally of the secondary cabinet;
  the accessory unit support system includes a coupling bracket configured to secure the accessory cabinet to each of the primary cabinet and, alternatively, the secondary cabinet;
  each of the accessory cabinet, the primary cabinet and the secondary cabinet includes an integral coupling feature to cooperate with the coupling bracket to secure the coupling bracket thereto;
  the accessory unit support system includes a plurality of fasteners;
  the coupling features of the accessory cabinet, the primary cabinet and the secondary cabinet are configured to mate with the plurality of fasteners to secure the coupling bracket to the accessory cabinet, the primary cabinet and the secondary cabinet, respectively; and at least one of the accessory cabinet, the primary cabinet and the secondary cabinet includes a coupling bracket seat slot configured and positioned to receive the coupling bracket therein.

2. The electrical power supply system of claim 1 wherein the accessory unit is selected from the group consisting of an external battery cabinet, a distribution cabinet, a maintenance bypass cabinet, a tie cabinet, and an input transformer cabinet.

3. The electrical power supply system of claim 1 wherein the primary electrical unit is an uninterruptible power supply (UPS).

4. The electrical power supply system of claim 1 wherein:
the accessory unit is selected from the group consisting of an external battery cabinet, a distribution cabinet, a maintenance bypass cabinet, a tie cabinet, and an input transformer cabinet; and
the primary electrical unit is an uninterruptible power supply (UPS); and
the secondary electrical unit is selected from the group consisting of an external battery cabinet, a distribution cabinet, a maintenance bypass cabinet, a tie cabinet, and an input transformer cabinet.

5. The electrical power supply system of claim 1 wherein:
the coupling bracket is a roof coupling bracket configured to secure the accessory cabinet to each of a roof panel of the primary cabinet and, alternatively, a roof panel of the secondary cabinet; and
the accessory unit support system further includes a base coupling bracket configured to secure the accessory cabinet to each of a base panel of the primary cabinet and, alternatively, a base panel of the secondary cabinet.

6. The electrical power supply system of claim 1 wherein the accessory unit support system includes at least one floor support bracket configured to temporarily structurally support the accessory unit in a freestanding mode.

7. A method for managing an electrical power supply system, the method comprising:
providing:
a freestanding primary electrical unit including a freestanding primary cabinet containing a primary electrical component;
a non-freestanding accessory unit including a non-freestanding accessory cabinet containing an accessory electrical component; and
an accessory unit support system;
forming a first installation including the accessory unit, including coupling the accessory cabinet to the primary cabinet using the accessory unit support system such that the accessory unit is thereby structurally supported by the primary electrical unit and the accessory cabinet is disposed adjacent and externally of the primary cabinet; thereafter
selectively decoupling the accessory cabinet from the primary cabinet; and thereafter
forming a second installation including the accessory unit and configured differently than the first installation, including alternatively structurally supporting the accessory unit using the accessory support system;
wherein:
the primary cabinet includes a base panel, a side panel, and an opening defined in the side panel thereof;
the accessory cabinet includes a base panel, a side panel, and an opening defined in the side panel thereof;

the accessory unit support system includes a base coupling bracket; and
in the first installation, the base coupling bracket extends through the opening of the primary cabinet and through the opening of the accessory cabinet and is secured to each of the base panel of the primary cabinet and the base panel of the accessory cabinet.

8. The method of claim 7 wherein the accessory unit is selected from the group consisting of an external battery cabinet, a distribution cabinet, a maintenance bypass cabinet, a tie cabinet, and an input transformer cabinet.

9. The method of claim 7 wherein the primary electrical unit is an uninterruptible power supply (UPS).

10. The method of claim 7 wherein:
the electrical power supply system further includes a freestanding secondary electrical unit including a freestanding secondary cabinet containing a secondary electrical component; and
the step of alternatively structurally supporting the accessory unit using the accessory support system includes coupling the accessory cabinet to the secondary cabinet such that the accessory unit is thereby structurally supported by the secondary electrical unit and the accessory cabinet is disposed adjacent and externally of the secondary cabinet.

11. The method of claim 10 wherein:
the accessory unit is selected from the group consisting of an external battery cabinet, a distribution cabinet, a maintenance bypass cabinet, a tie cabinet, and an input transformer cabinet; and
the primary electrical unit is an uninterruptible power supply (UPS); and
the secondary electrical unit is selected from the group consisting of an external battery cabinet, a distribution cabinet, a maintenance bypass cabinet, a tie cabinet, and an input transformer cabinet.

12. The method of claim 10 wherein:
the accessory unit support system includes a second coupling bracket;
the step of coupling the accessory cabinet to the primary cabinet includes securing the accessory cabinet to the primary cabinet using the second coupling bracket; and
the step of coupling the accessory cabinet to the secondary cabinet includes securing the accessory cabinet to the secondary cabinet using the second coupling bracket.

13. The method of claim 12 wherein each of the accessory cabinet, the primary cabinet and the secondary cabinet includes an integral coupling feature to cooperate with the second coupling bracket to secure the second coupling bracket thereto.

14. The method of claim 13 wherein:
the step of securing the accessory cabinet to the primary cabinet includes securing the second coupling bracket to the primary cabinet using at least one fastener mated to the coupling feature of the primary cabinet; and
the step of securing the accessory cabinet to the secondary cabinet includes securing the second coupling bracket to the secondary cabinet using at least one fastener mated to the coupling feature of the secondary cabinet.

15. The method of claim 14 wherein at least one of the accessory cabinet, the primary cabinet and the secondary cabinet includes a coupling bracket seat slot configured and positioned to receive the second coupling bracket therein.

16. The method of claim 14 wherein:
the second coupling bracket is a roof coupling bracket;
the step of coupling the accessory cabinet to the primary cabinet includes:

coupling a roof panel of the accessory cabinet to a roof panel of the primary cabinet using the roof coupling bracket; and coupling the base panel of the accessory cabinet to the base panel of the primary cabinet using the base coupling bracket; and the step of coupling the accessory cabinet to the secondary cabinet includes:

coupling the roof panel of the accessory cabinet to a roof panel of the secondary cabinet using the roof coupling bracket; and coupling the base panel of the accessory cabinet to the base panel of the secondary cabinet using the base coupling bracket.

17. The method of claim 7 wherein, in the first installation, each of the primary cabinet and the accessory cabinet rest on a common support surface.

18. The method of claim 17 wherein, in the first installation, the primary cabinet and the accessory cabinet are disposed side-by-side.

19. The method of claim 7 wherein, in the first installation, the accessory cabinet is disposed substantially entirely externally of the primary cabinet.

\* \* \* \* \*